United States Patent
Cho et al.

(10) Patent No.: US 7,936,849 B2
(45) Date of Patent: May 3, 2011

(54) DECODING DEVICE AND METHOD

(75) Inventors: Chun-Ming Cho, Chi-Lung (TW);
Cheng-Kang Wang, Tai-Chung (TW);
Liang-Hui Lee, Tai-Nan (TW);
Kuang-Yu Yen, Tai-Chung (TW)

(73) Assignee: Realtek Semiconductor Corp., Science Park, HsinChu (TW)

( * ) Notice: Subject to any disclaimer, the term of this patent is extended or adjusted under 35 U.S.C. 154(b) by 1092 days.

(21) Appl. No.: 11/682,846

(22) Filed: Mar. 6, 2007

(65) Prior Publication Data
US 2007/0236370 A1    Oct. 11, 2007

(30) Foreign Application Priority Data
Mar. 23, 2006   (TW) .............................. 95110126 A

(51) Int. Cl.
*H04L 27/06*   (2006.01)

(52) U.S. Cl. ........................ 375/341; 375/265

(58) Field of Classification Search ............... 375/340, 375/341, 260, 265
See application file for complete search history.

(56) References Cited

U.S. PATENT DOCUMENTS
2005/0025076 A1 * 2/2005 Chaudhuri et al. .......... 370/310
2006/0013323 A1   1/2006 Tsai

FOREIGN PATENT DOCUMENTS
CN           1722715 A       1/2006

* cited by examiner

*Primary Examiner* — Dac V Ha
(74) *Attorney, Agent, or Firm* — Winston Hsu; Scott Margo

(57) ABSTRACT

The present invention discloses a decoding device. The decoding device includes a scaling unit for adjusting a received signal according to a scaling coefficient to generate a scaled signal; a quantizer coupled to the scaling unit for generating a quantized signal by quantizing the scaled signal; a soft decision decoder coupled to the quantizer for decoding the quantized signal to generate a decoded signal; and a scaling coefficient generating unit coupled to the scaling unit for generating the scaling coefficient according to a system information of the decoding device.

30 Claims, 6 Drawing Sheets

DECODING DEVICE AND METHOD

BACKGROUND OF THE INVENTION

1. Field of the Invention

The present invention relates to decoding device, and more particularly, to a soft decision decoding device and method thereof.

2. Description of the Prior Art

The main difference between soft decision decoders and hard decision decoders is that when a received signal contains a one-bit amount of data, for example, with the received signal value of 1 or −1 representing a 1 or a 0 in said bit, hard decision decoders represent said received signal with only one bit, while soft decision decoders represent said received signal with two or more bits. Because it is inevitable that the communications channel tends to attenuate the received signal, the actual value of the received signal could be 0.8, 0.65, or 0.7 out of the nominal 1.0. Therefore, a slicer added in front of the hard decision decoder is usually desired, so that a received signal value larger than zero is judged as 1, and a received signal value smaller than zero is judged as −1. The soft decision decoder is a lot more complicated. In the front of the soft decision decoder a quantizer for quantizing the value of the received signal into a plurality of levels between 1 and −1 is present. For examples, levels such as −1, −0.8, −0.6, −0.4, −0.2, 0, 0.2, 0.4, 0.6, 0.8, and 1 can be determined. Accordingly, the output of the quantizer has 11 different output levels, and at least 4 bits is required to represent the quantized signal. Because the value of the quantized signal is not limited to just −1 or 1, but with higher resolution, the soft decision decoder can determine the reliability of the received signal according to the level of the quantized signal. In other words, the reliability of the received signal is higher when it is quantized to approach 1 or −1. The reliability of the received signal is lower when it is quantized to approach 0.

Because the values of the received signal may vary according to the communications environment, but the number of levels of the quantizer remains unchanged, the generated quantized signal may fall predominantly at certain specific quantizing levels, with the other levels unused and wasted. As a result, the advantage of the soft decision decoder is substantially undermined.

SUMMARY OF THE INVENTION

Therefore, an objective of the present invention is to provide a decoding device, which is capable of scaling a received signal of a quantizer, in order to fully make use of the input dynamic range of the quantizer.

According to an embodiment of the present invention, a decoding device is disclosed. The decoding device includes a scaling unit, a quantizer, a soft decision decoder, and a scaling coefficient generating unit. The scaling unit adjusts a received signal according to a scaling coefficient to generate a scaled signal. The quantizer coupled to the scaling unit for generating a quantized signal by quantizing the scaled signal. The soft decision decoder coupled to the quantizer for decoding the quantized signal to generate a decoded signal. The scaling coefficient generating unit coupled to the scaling unit for generating the scaling coefficient according to a system information of the decoding device.

According to an embodiment of the present invention, a decoding method is disclosed. The decoding method includes the steps of: utilizing a scaling coefficient to adjust a received signal to generate a scaled signal; quantizing the scaling unit to generate a quantized signal; decoding the quantized signal to generate a decoded signal; and generating the scaling coefficient according to a system information of the decoding device.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
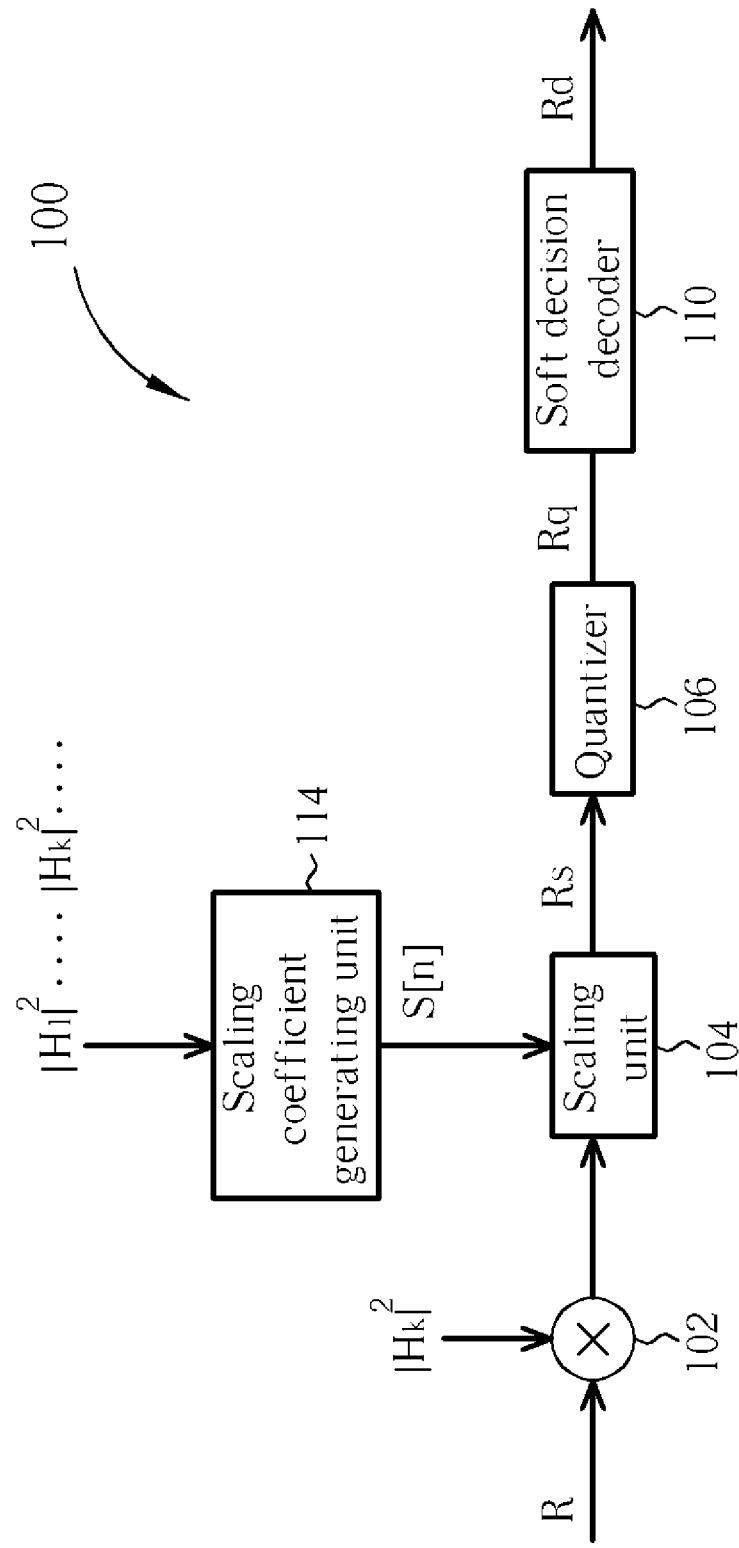
FIG. 1 is a diagram illustrating a decoding device according to a first embodiment of the present invention.

Please refer to FIG. 1. FIG. 1 is a diagram illustrating a decoding device 100 according to a first embodiment of the present invention. In this embodiment, the decoding device 100 is applied in a multi-tone system, such as an orthogonal frequency division multiplexing (OFDM) system, and a received signal R is a multi-tone signal. Thus the received signal R contains a plurality of sub-data respectively carried by various sub-carriers. Those skilled in the art will understand that the embodiment of the present invention described in the following can also be applied in other types of communications systems, be it wired or wireless, and is not limited to an OFDM system. In FIG. 1, the decoding device 100 comprises a channel response compensation unit 102, a scaling unit 104, a quantizer 106, a soft decision decoder 110, and a scaling coefficient generating unit 114. Firstly, the channel response compensation unit 102, according to channel response $|H_k|^2$ of each sub-carrier, adjusts the amplitude of the corresponding sub-data. Because the reliability of sub-data transmitted by a sub-carrier with poor channel response is often low, the channel response compensation unit 102 will then suppress the sub-data transmitted by the poor sub-carrier. Similarly, because the reliability of sub-data transmitted by a sub-carrier with good channel response is often high, the channel response compensation unit 102 will then enhance the sub-data transmitted by the good sub-carrier. Please note that, the decoding device of the present invention is not limited for using in a multi-tone system. When the decoding device applies to a communications system with a single carrier, the channel response compensation unit 102 that adjusts the amplitude of each sub-data becomes not required.

The scaling unit 104 utilizes a scaling coefficient S[n] to adjust all sub-data of the received signal R, to output a scaled signal Rs. In this embodiment, the scaling unit 104 can be implemented with a multiplier, and the scaling unit 104 outputs a multiplied result of the scaling coefficient S[n] and the received signal R as the above-mentioned scaled signal Rs. The quantizer 106 is utilized to quantize the scaled signal Rs, to generate a quantized signal Rq. Finally, the soft decision decoder 110 decodes the quantized signal Rq to generate a decoded signal Rd.

In FIG. 1, the scaling coefficient S[n] utilized by the scaling unit 104 is generated by the scaling coefficient generating unit 114. The scaling coefficient generating unit 114 of the present invention can generate the scaling coefficient S[n] according to one of various schemes, in order to get a better quantization result. In this embodiment, the scaling coefficient generating unit 114 determines a suitable scaling coefficient S[n] conforming to the following condition:

$$\min_s |Prob(W(n,k) \cdot S[n] > thd) - 0.51,\ W(n,k) = |H_K(n)|^2 \quad (1)$$

If the operating range of the quantizer 106 (i.e., the dynamic range of the quantized signal), after normalization, falls between $-1 \sim 1$, then the parameter thd in condition (1) corresponds to the middle value of the operating range of the quantizer 106 and has a value of $\frac{1}{2}E[|R|]$, wherein $E[|R|]$ represents the mean value of the received signal R, W[n,k] represents the frequency response of the $n^{th}$ symbol on the $k^{th}$ sub-carrier, the operator "Prob" represents the probability of occurrence, and the operator "min" represents the minimum value. Therefore, by determining a scaling coefficient S[n] conforming to condition (1); that is, when the probability of W[n,k]·S being larger than thd is closest to the probability of W[n,k]·S being smaller than thd, the resulting scaling coefficient S[n] will render W[n,k]·S evenly distributed at both sides of thd within the operating range of the equalizer 106. Please note that, as an alternative, the scaling coefficient generating unit 114 of the present invention can also calculate the mean of W[n,k] first, and then calculate the scaling coefficient S[n] by using the following equation: S[n]=thd/mean (W[n,k]), so that the effort of calculation can be reduced.

Figure 2:
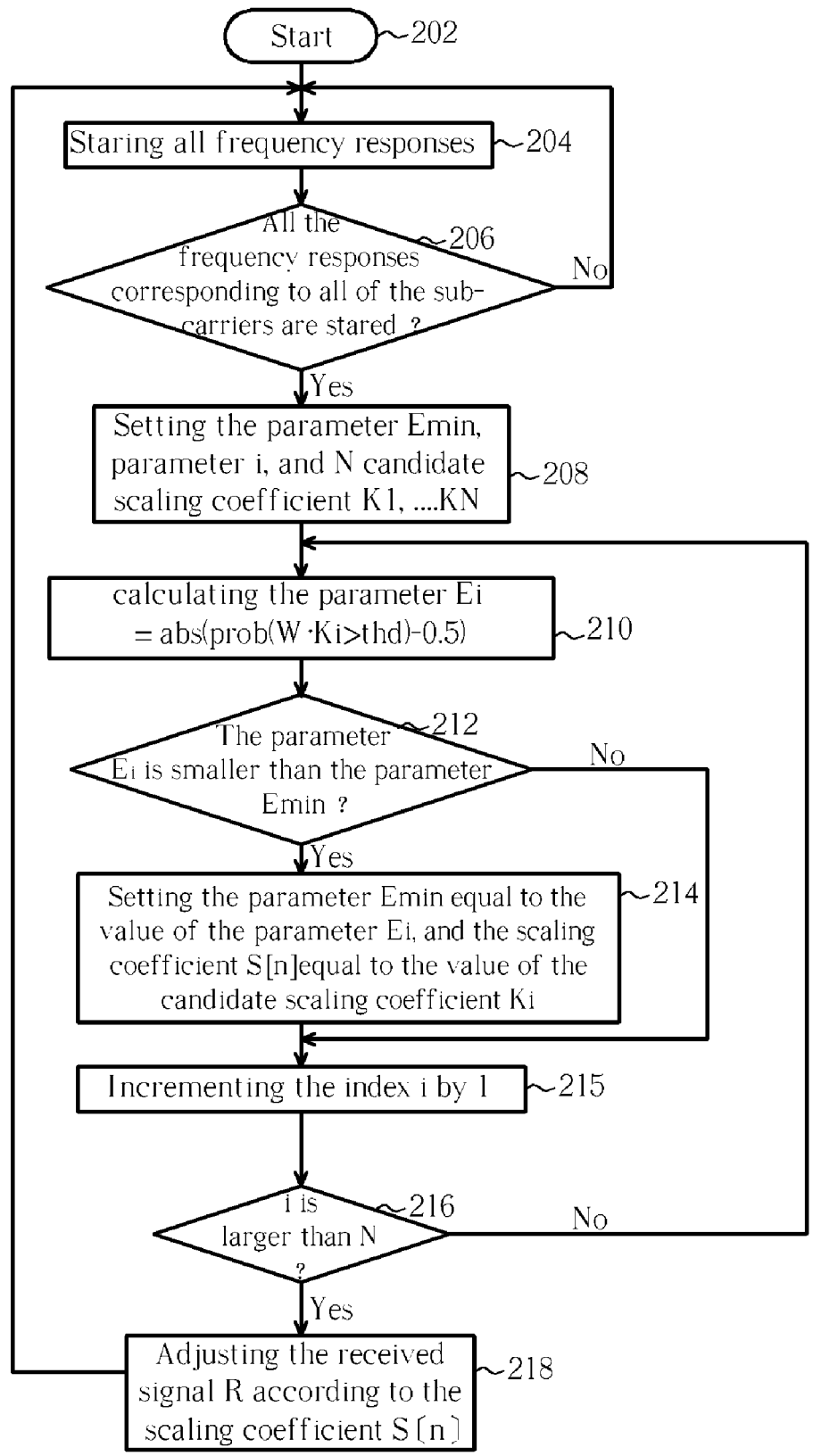
FIG. 2 is a flowchart illustrating the generation of a scaling coefficient for the decoding device according to the first embodiment of the present invention.

Please together refer to FIG. 1 and FIG. 2. FIG. 2 is a flowchart illustrating the generation of the scaling coefficient S[n] for the decoding device 100 according to the first embodiment of the present invention. The method comprises the following steps:

Step 202: start;
Step 204: storing the frequency responses W corresponding to all of the sub-carriers;
Step 206: determining whether the frequency responses corresponding to all of the sub-carriers are stored; if yes, then go to step 208; if no, then go to step 204;
Step 208: setting the parameter Emin as 1, the index i as 1, and setting N candidate scaling coefficient K1, . . . KN to different values;
Step 210: calculating the parameter Ei=abs(prob (W·Ki>thd)−0.5);
Step 212: determining whether the parameter Ei is smaller than the parameter Emin? If yes, then go to step 214; if no, then go to step 215;
Step 214: setting the parameter Emin equal to the value of the parameter Ei, and setting the scaling coefficient S[n] equal to the value of the candidate scaling coefficient Ki:
Step 215: incrementing the index i by 1;
Step 216: determining whether i is larger than N? If yes, then go to step 218; if no, then go to step 210;
Step 218: adjusting the received signal R according to the scaling coefficient S[n].

As shown in the above-mentioned description, the decoding device 100 first utilizes a channel estimator (not shown) to estimate the frequency response of each sub-carrier W[n,k] in the $n^{th}$ symbol. The scaling coefficient generating unit 114 then executes step 202~216 to generate the scaling coefficient S[n]. After the scaling coefficient S[n] is generated, the scaling unit 104 can then use the scaling coefficient S[n] to adjust the received signal R (step 218).

Figure 3:
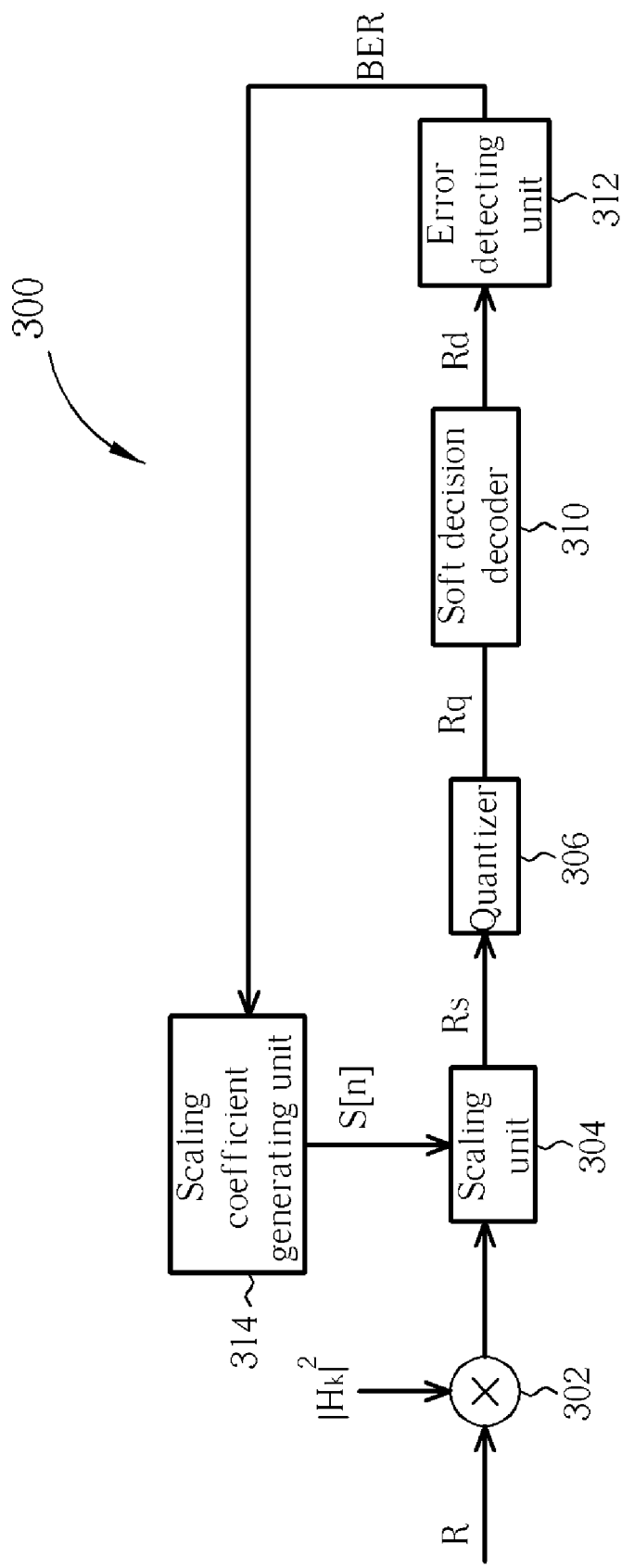
FIG. 3 is a diagram illustrating a decoding device according to a second embodiment of the present invention.

Please refer to FIG. 3. FIG. 3 is a diagram illustrating a decoding device 300 according to a second embodiment of the present invention. In FIG. 3, the decoding device 300 comprises a channel response compensation unit 302, a scaling unit 304, a quantizer 306, a soft decision decoder 310, an error detecting unit 312, and a scaling coefficient generating unit 314. Except for the error detecting unit 312 and the scaling coefficient generating unit 314, the parts bearing the same name in FIG. 3 and FIG. 1 are configured the same and operate in the same manner, therefore further detailed descriptions regarding those parts in FIG. 3 are herein omitted. After the soft decision decoder 310 decodes the quantized signal Rq to generate the decoded signal Rd, the error detecting unit 312 further estimates a bit error rate BER of the decoded signal Rd, and the scaling coefficient generating unit 314 determines the most suitable scaling coefficient S[n] according to the numerous bit error rates BER respectively corresponding to the received signal R at various times. The generation of the scaling coefficient S[n] will be further described in FIG. 4.

Please note that, the error detecting unit 312 may generate the bit error rate BER in various ways. For example, when the decoding device 300 receives a training code, the error detecting unit 312 can calculate the bit error rate BER through comparison of the training code and the decoded signal Rd since the contents of the training code are known. Alternatively, when the encoding device corresponding to the decoding device 300 utilizes an inner code and an outer code to perform encoding, the soft decision unit 310 and the error detecting unit 312 can be respectively implemented as an inner code decoder and an outer code decoder. For example, the soft decision unit 310 can be a soft decision Viterbi decoder, and the error detecting unit 312 can be a Reed Soloman Product Code, or RSPC, decoder. Consequently, the error detecting unit 312 can determine the bit error rate BER of the decoded signal Rd according to the decoding result.

Figure 4:
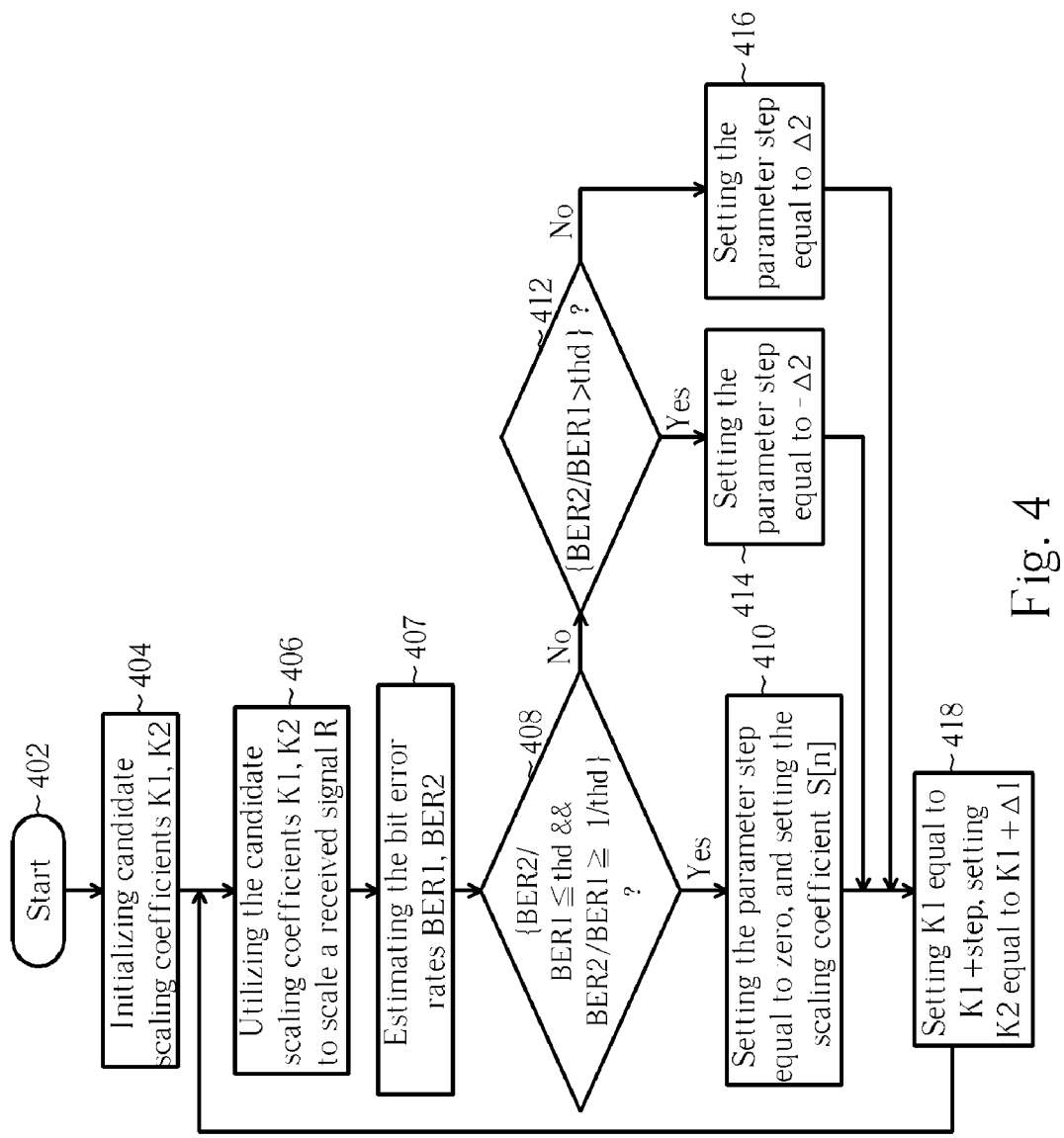
FIG. 4 is a flowchart illustrating the generation of the scaling coefficient for the decoding device according to the second embodiment of the present invention.

Please together refer to FIG. 3 and FIG. 4. FIG. 4 is a flowchart illustrating the generation of the scaling coefficient S[n] of the decoding device 300 according to the second embodiment of the present invention. The second embodiment comprises the following steps:

Step 402: start;
Step 404: initializing candidate scaling coefficients K1, K2, wherein K2=K1+Δ1;
Step 406: utilizing the candidate scaling coefficients K1, K2 to scale a received signal R or two received signals R adjacent in time;
Step 407: estimating the bit error rates BER1, BER2 respectively corresponding to the candidate scaling coefficients K1, K2;
Step 408: determining whether the condition: {BER2/BER1≦thd && BER2/BER1≧(1/thd)} holds; if yes, then go to step 410, if no, then go to step 412;
Step 410: setting the parameter step equal to zero, and setting the scaling coefficient S[n] equal to the value of K1, then go to step 418;
Step 412: determining whether the condition: {BER2/BER1>thd} holds; if yes, then go to step 414, if no, then go to step 416;
Step 414: setting the parameter step equal to −Δ2, and go to step 418;

Step 416: setting the parameter step equal to Δ2, and go to step 418;

Step 418: setting K1 equal to K1+step, setting K2 equal to K1+Δ1, and go to step 406.

In this embodiment, the scaling coefficient generating unit 314 provides two candidate scaling coefficients K1, K2 to the scaling unit 304 (step 404), for scaling a received signal R(n) or two received signals R(n), R(n+1) adjacent in time (step 406). After the received signal R passes through the quantizer 306 and the soft decision unit 310, the error detecting unit 312 respectively estimates and renders the bit error rate BER1, BER2 generated by using the candidate scaling coefficients K1, K2 (step 407). The scaling coefficient generating unit 314 then adjusts the candidate scaling coefficients K1, K2 according to the values of the bit error rates BER1, BER2 (step 408~418). In FIG. 4, if the ratio of BER2/BER1 is greater than a threshold value thd, the scaling coefficient generating unit 314 reduces both the candidate scaling coefficients K1, K2 (step 414, 418); if the ratio of BER2/BER1 is smaller than a threshold value 1/thd, the scaling coefficient generating unit 314 increases both the candidate scaling coefficients K1, K2 (step 416, 418); and if the ratio of BER2/BER1 falls between the threshold values thd and 1/thd, the scaling coefficient generating unit 314 sets the scaling coefficient S[n] to be the value of the candidate scaling coefficient K1, and skips updating the candidate scaling coefficients K1, K2 (step 410, 418).

Please note that, when the scaling coefficient generating unit 314 decides to skip updating the candidate scaling coefficients K1, K2, the scaling coefficient S[n] can also be alternatively set to be the value of the candidate scaling coefficient K2, and the disclosure of the present embodiment is not meant to be limiting. Furthermore, although the adjusting mechanism of the above-mentioned candidate scaling coefficients K1, K2 is determined by the ratio between the bit error rates BER2, BER1, in other embodiments a difference between the bit error rates BER2, BER1 can also be referenced to adjust the candidate scaling coefficients K1, K2, and the disclosure of the present embodiment is not meant to be limiting.

Furthermore, the decoding device 300 in FIG. 3 can also adopt other decoding schemes, such as directly checking the signal-to-noise ratio, or SNR. If the SNR is good, e.g., the SNR is greater than a threshold value, then the scaling coefficient S[n] will be increased. Conversely, if the SNR is not satisfactory, e.g., the SNR is lower than another threshold value, then the scaling coefficient S[n] will be decreased.

Figure 5:
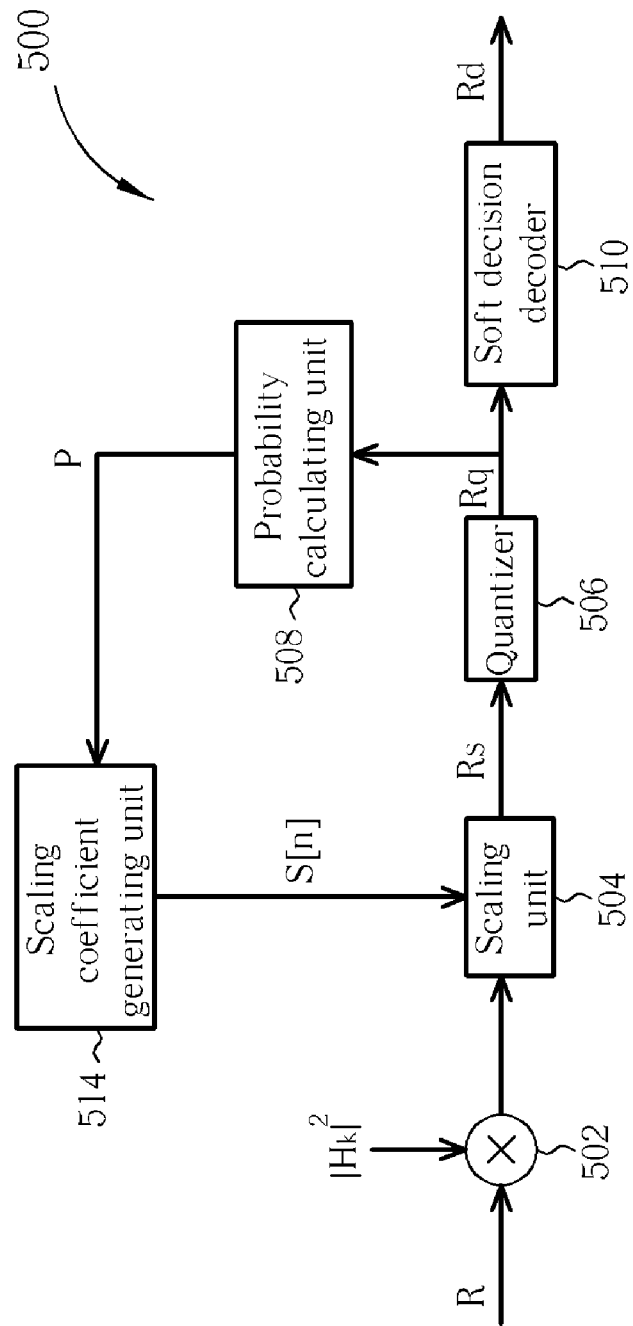
FIG. 5 is a diagram illustrating a decoding device according to a third embodiment of the present invention.

Please refer to FIG. 5. FIG. 5 is a diagram illustrating a decoding device 500 according to a third embodiment of the present invention. In FIG. 5, the decoding device 500 comprises a channel response compensation unit 502, a scaling unit 504, a quantizer 506, a probability calculating unit 508, a soft decision decoder 510, and a scaling coefficient generating unit 514. Except for the probability calculating unit 508 and the scaling coefficient generating unit 514, the parts bearing the same name in FIG. 5 and FIG. 1 are configured the same and operate in the same manner, therefore further detailed descriptions regarding those parts in FIG. 5 are herein omitted. In this embodiment, the probability calculating unit 508 is used to gather statistics of the probability P of the plurality of sub-data, which correspond to the quantized signal Rq, being equal to zero. The scaling coefficient generating unit 514 generates the scaling coefficient S[n] according to the probability P corresponding to a plurality of candidate scaling coefficients K1, ... KN.

Figure 6:
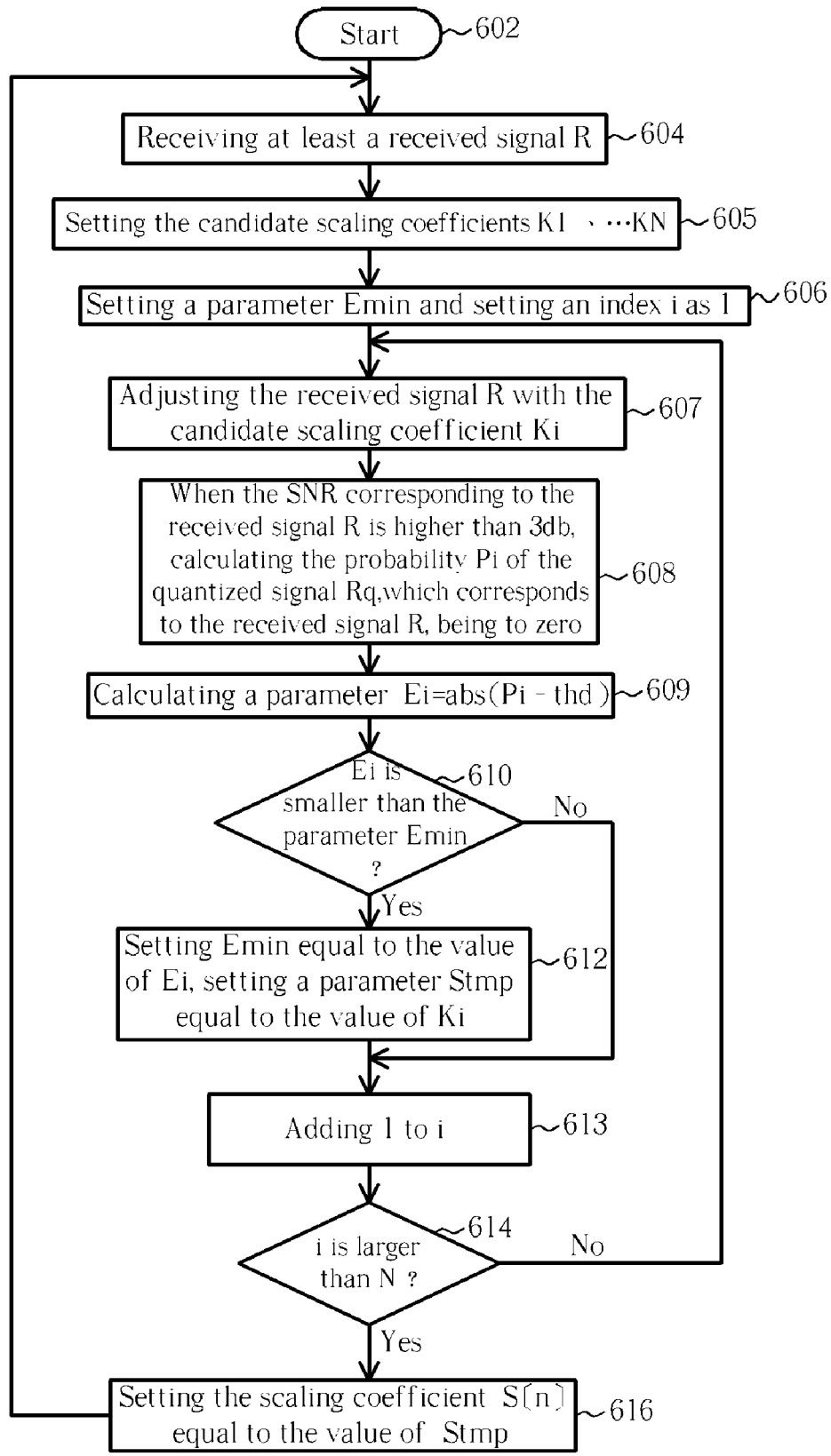
FIG. 6 is a flowchart illustrating the generation of the scaling coefficient for the decoding device according to the third embodiment of the present invention.

Please together refer to FIG. 5 and FIG. 6. FIG. 6 is a flowchart illustrating the generation of the scaling coefficient S[n] of the decoding device 500 according to the third embodiment of the present invention. The third embodiment comprises the following steps:

Step 602: start;

Step 604: receiving at least a received signal R;

Step 605: setting the candidate scaling coefficients K1, ... KN as different values;

Step 606: setting a parameter Emin as 1 and setting an index i as 1;

Step 607: adjusting the received signal R with the candidate scaling coefficient Ki;

Step 608: when the SNR corresponding to the received signal R is higher than 3 db, calculating the probability Pi of the quantized signal Rq, which corresponds to the received signal R, being equal to zero;

Step 609: calculating a parameter Ei=abs(Pi−thd):

Step 610: determining whether the parameter Ei is smaller than the parameter Emin? If yes, then go to step 612; if no, then go to step 613;

Step 612: setting Emin equal to the value of Ei, setting a parameter Stmp equal to the value of Ki, and adding 1 to i;

Step 613: adding 1 to i;

Step 614: determining whether i is larger than N? If yes, then go to step 616; if no, then go to step 607;

Step 616: setting the scaling coefficient S[n] equal to the value of Stmp, and go back to step 604.

In this embodiment, the scaling coefficient generating unit 514 provides a group of candidate scaling coefficients K1, ... KN to the scaling unit 504 (step 605), for adjusting a single received signal R and a plurality of subsequent received signals R adjacent in time (step 607). After the received signal R passes through the quantizer 506, the probability calculating unit 508 estimates, for each candidate scaling coefficient Ki, the probability Pi of the quantized signal Rq being equal to zero (step 608). The scaling coefficient generating unit 514 then calculates the corresponding parameter Ei according to the probability Pi (step 609). Finally, the scaling coefficient generating unit 514 sets the candidate scaling coefficient Ki corresponding to the parameter Ei with the minimum value as scaling coefficient S[n] (step 610~616).

Please note that, the threshold value thd in step 609 is a predetermined bit error rate for a specific environment, and in this embodiment the bit error rate when the SNR of the received signal R is higher than 3 db serves as an example of such a threshold value thd. Furthermore, although the above-mentioned embodiment selects a preferred candidate scaling coefficient Ki according to the difference Ei between the probability Pi and the threshold value thd, the present invention is not limited to such an exemplary embodiment. For example, as an alternative the scaling coefficient generating unit 514 can also use a ratio between the probability Pi and the threshold value thd to select a preferred candidate scaling coefficient Ki with said ratio being closest to 1, as the scaling coefficient S[n]. Furthermore, although in the step 608 a condition of the SNR of the received signal R being higher than 3 db is used for the purpose of calculating the probability Pi, the present invention is not limited to such an exemplary embodiment. In other embodiments, a condition of the SNR being higher than or lower than a specific value can also be used. Furthermore, although in the embodiment the probability of the quantized signal being equal to zero is calculated, the present invention is not limited to such an exemplary embodiment. In other embodiments the present invention can also calculate the probability of the quantized signal Rq falling on both the positive saturation value and the negative saturation value.

According to the above-mentioned embodiments, a decoding device of the present invention comprises a scaling unit for adjusting the amount of a received signal according to a scaling coefficient in order to maximize the efficiency of the quantizer, which in turn will improve the accuracy of a decoded signal.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A decoding device, comprising:
a scaling unit, for adjusting a received signal according to a scaling coefficient and generating a scaled signal;
a quantizer, coupled to the scaling unit, for generating a quantized signal by quantizing the scaled signal;
a soft decision decoder, coupled to the quantizer, for decoding the quantized signal and generating a decoded signal; and
a scaling coefficient generating unit, coupled to the scaling unit, for generating the scaling coefficient according to system information of the decoding device;
wherein the input signal is a multi-tone signal, the system information comprises a plurality channel response values that correspond to the input signal, and the scaling coefficient generating unit calculates the scaling coefficient such that a product of a mean value of absolute squares of the channel response values and the scaling coefficient approximates to a predetermined value.

2. The decoding device of claim 1, further comprising:
an error detecting unit, coupled to the scaling coefficient generating unit, for estimating a first bit error rate (BER) corresponding to a first input signal after the first input signal is adjusted by a first scaling coefficient through the scaling unit; and further estimating a second bit error rate corresponding to a second input signal after the second input signal is adjusted by a second scaling coefficient through the scaling unit;
wherein the system information comprises the first bit error rate and the second bit error rate, the first scaling coefficient is larger than the second scaling coefficient, and the scaling coefficient generating unit decreases the first and the second scaling coefficients when a difference between the second bit error rate and the first bit error rate is smaller than a first threshold value, the scaling coefficient generating unit increases the first and the second scaling coefficients when the difference between the second bit error rate and the first bit error rate is larger than a second threshold value; and the scaling coefficient generating unit selects one of the first and the second scaling coefficients as the scaling coefficient when the difference between the second bit error rate and the first bit error rate is between the first and the second threshold values.

3. The decoding device of claim 1 further comprising:
a probability calculating unit, coupled to the scaling coefficient generating unit, for estimating a first probability of a first quantized signal that is equal to zero, where the first quantized signal corresponds to the first input signal, and estimating a second probability of a second quantized signal that is equal to zero, where the second quantized signal corresponds to the second input signal;
wherein the system information comprises a first different value and a second different value, the first different value is the different between the first probability and a threshold value, the second different value is the different between the second probability and the threshold value, and the scaling coefficient generating unit determines the scaling coefficient according to the first and the second different values.

4. The decoding device of claim 3, wherein if the first different value is the minimum value among the first and the second different values, the scaling coefficient generating unit selects the first scaling coefficient as the scaling coefficient.

5. The decoding device of claim 3, wherein the threshold value corresponds to a predetermined bit error rate.

6. The decoding device of claim 1, further comprising:
an error detecting unit, coupled to the scaling coefficient generating unit and the soft decision decoder, for estimating a first bit error rate (BER) corresponds to a first input signal after the first input signal is adjusted by a first scaling coefficient through the scaling unit, and estimating a second bit error rate corresponds to a second input signal after the second input signal is adjusted by a second scaling coefficient through the scaling unit;
wherein the system information comprises the first and the second bit error rates, the first scaling coefficient is larger than the second scaling coefficient, the scaling coefficient generating unit calculates a ratio between the second bit error rate and the first bit error rate, the scaling coefficient generating unit decreases the first and second scaling coefficients when the ratio is smaller than a first threshold value, the scaling coefficient generating unit increases the first and the second scaling coefficients when the ratio is larger than a second threshold value; and the scaling coefficient generating unit selects one of the first and the second scaling coefficients as the scaling coefficient when the ratio is between the first and the second threshold values.

7. The decoding device of claim 1, further comprising:
a probability calculating unit, coupled to the scaling coefficient generating unit and the quantizer, for estimating a first probability of a first quantized signal being equal to zero, where the first quantized signal corresponds to the first input signal; and further estimating a second probability of a second quantized signal being equal to zero, where the second quantized signal corresponds to the second input signal;
wherein the system information comprises a first ratio of the first probability and a threshold value, and a second ratio of the second probability and the threshold value, and the scaling coefficient generating unit determines the scaling coefficient according to the first ratio and the second ratio.

8. The decoding device of claim 7, wherein when the first ratio is larger than one and when the first ratio is the minimum among the first and second ratios, the scaling coefficient generating unit selects the first scaling coefficient as the scaling coefficient.

9. The decoding device of claim 7, wherein the threshold value corresponds to a predetermined bit error rate.

10. The decoding device of claim 1, wherein the scaling unit comprises:
a multiplier, coupled to a channel compensation unit, for multiplying the scaling coefficient and the received signal to generate the scaled signal.

11. The decoding device of claim 1 being applied to an orthogonal frequency division multiplexing (OFDM) system, where the input signal is a de-mapped signal.

12. A decoding method comprising:
utilizing a scaling coefficient to adjust a received signal to generate a scaled signal;
quantizing the scaling unit to generate a quantized signal;

decoding the quantized signal to generate a decoded signal; and generating the scaling coefficient according to a system information of the decoding device;

wherein the input signal is a multi-tone signal, the system information comprises a plurality channel response values that correspond to the input signal, and the step of generating the scaling coefficient comprises:

calculating the scaling coefficient such that a product of a mean value of absolute squares of the channel response values and the scaling coefficient approximates to a predetermined value.

13. The decoding method of claim 12, further comprising:
estimating a first bit error rate (BER) corresponding to a first input signal after the first input signal is adjusted by a first scaling coefficient; and estimating a second bit error rate corresponding to a second input signal after the second input signal is adjusted by a second scaling coefficient; and the step of generating the scaling coefficient further comprises:

decreasing the first and second scaling coefficients when a difference between the second bit error rate and the first bit error rate is smaller than a first threshold value;

increasing the first and second scaling coefficients when the difference between the second bit error rate and the first bit error rate is larger than a second threshold value; and selecting one of the first and the second scaling coefficients as the scaling coefficient when the difference between the second bit error rate and the first bit error rate is between the first and the second threshold values.

14. The decoding method of claim 12, further comprising:
estimating a first probability of a first quantized signal being equal to zero, where the first quantized signal corresponds to the first input signal; and estimating a second probability of a second quantized signal being equal to zero, where the second quantized signal corresponds to the second input signal;

wherein the system information comprises a first different value between the first probability and a threshold value, and a second different value between the second probability and the threshold value.

15. The decoding method of claim 14, wherein the step of generating the scaling coefficient further comprises:

if the first different value is the minimum value among the first and the second different values, the scaling coefficient generating unit selects the first scaling coefficient as the scaling coefficient.

16. The decoding method of claim 14, wherein the threshold value corresponds to a predetermined bit error rate.

17. The decoding method of claim 12, further comprising:
estimating a first bit error rate (BER) corresponding to a first input signal after the first input signal is adjusted by a first scaling coefficient; and estimating a second bit error rate corresponding to a second input signal after the second input signal is adjusted by a second scaling coefficient, wherein the system information comprises the first and the second bit error rates, and the first scaling coefficient is larger than the second scaling coefficient; and the step of generating the scaling coefficient, comprising:
calculating a ratio of the second bit error rate and the first bit error rate;

decreasing the first and second scaling coefficients when the ratio is smaller than a first threshold value;

increasing the first and second scaling coefficients when the ratio is larger than a second threshold value; and selecting one of the first and second scaling coefficients as the scaling coefficient when the ratio is between the first and the second threshold values.

18. The decoding method of claim 12, further comprising:
estimating a first probability of a first quantized signal being equal to zero, where the first quantized signal corresponds to the first input signal; and estimating a second probability of a second quantized signal being equal to zero, where the second quantized signal corresponds to the second input signal;

wherein the system information comprises a first ratio of the first probability and a threshold value, and a second ratio of the second probability and the threshold value.

19. The decoding method of claim 18, wherein the step of generating the scaling coefficient comprises:

if the first ratio is a larger than one and the first ratio is the minimum value among the first and the second ratios, selecting the first scaling coefficient as the scaling coefficient.

20. The decoding method of claim 18, wherein the threshold value corresponds to a predetermined bit error rate.

21. The decoding method of claim 12, wherein the step of generating the scaled signal comprises:

multiplying the scaling coefficient and the received signal to generate the scaled signal.

22. The decoding method of claim 12 being applied to an orthogonal frequency division multiplexing (OFDM) system, wherein the input signal is a de-mapped signal.

23. A decoding device, comprising:
a scaling unit, for adjusting a received signal according to a scaling coefficient and generating a scaled signal;

a quantizer, coupled to the scaling unit, for generating a quantized signal by quantizing the scaled signal;

a soft decision decoder, coupled to the quantizer, for decoding the quantized signal and generating a decoded signal;

a scaling coefficient generating unit, coupled to the scaling unit, for generating the scaling coefficient according to system information of the decoding device; and an error detecting unit, coupled to the scaling coefficient generating unit, for estimating a first bit error rate (BER) corresponding to a first input signal after the first input signal is adjusted by a first scaling coefficient through the scaling unit; and further estimating a second bit error rate corresponding to a second input signal after the second input signal is adjusted by a second scaling coefficient through the scaling unit;

wherein the system information comprises the first bit error rate and the second bit error rate, the first scaling coefficient is larger than the second scaling coefficient, and the scaling coefficient generating unit decreases the first and the second scaling coefficients when a difference between the second bit error rate and the first bit error rate is smaller than a first threshold value, the scaling coefficient generating unit increases the first and the second scaling coefficients when the difference between the second bit error rate and the first bit error rate is larger than a second threshold value; and the scaling coefficient generating unit selects one of the first and the second scaling coefficients as the scaling coefficient when the difference between the second bit error rate and the first bit error rate is between the first and the second threshold values.

24. A decoding device, comprising:
a scaling unit, for adjusting a received signal according to a scaling coefficient and generating a scaled signal;
a quantizer, coupled to the scaling unit, for generating a quantized signal by quantizing the scaled signal;
a soft decision decoder, coupled to the quantizer, for decoding the quantized signal and generating a decoded signal;
a scaling coefficient generating unit, coupled to the scaling unit, for generating the scaling coefficient according to system information of the decoding device; and
a probability calculating unit, coupled to the scaling coefficient generating unit, for estimating a first probability of a first quantized signal that is equal to zero, where the first quantized signal corresponds to the first input signal, and estimating a second probability of a second quantized signal that is equal to zero, where the second quantized signal corresponds to the second input signal;
wherein the system information comprises a first different value and a second different value, the first different value is the different between the first probability and a threshold value, the second different value is the different between the second probability and the threshold value, and the scaling coefficient generating unit determines the scaling coefficient according to the first and the second different values.

25. A decoding device, comprising:
a scaling unit, for adjusting a received signal according to a scaling coefficient and generating a scaled signal;
a quantizer, coupled to the scaling unit, for generating a quantized signal by quantizing the scaled signal;
a soft decision decoder, coupled to the quantizer, for decoding the quantized signal and generating a decoded signal;
a scaling coefficient generating unit, coupled to the scaling unit, for generating the scaling coefficient according to system information of the decoding device; and
an error detecting unit, coupled to the scaling coefficient generating unit and the soft decision decoder, for estimating a first bit error rate (BER) corresponds to a first input signal after the first input signal is adjusted by a first scaling coefficient through the scaling unit, and estimating a second bit error rate corresponds to a second input signal after the second input signal is adjusted by a second scaling coefficient through the scaling unit;
wherein the system information comprises the first and the second bit error rates, the first scaling coefficient is larger than the second scaling coefficient, the scaling coefficient generating unit calculates a ratio between the second bit error rate and the first bit error rate, the scaling coefficient generating unit decreases the first and second scaling coefficients when the ratio is smaller than a first threshold value, the scaling coefficient generating unit increases the first and the second scaling coefficients when the ratio is larger than a second threshold value; and the scaling coefficient generating unit selects one of the first and the second scaling coefficients as the scaling coefficient when the ratio is between the first and the second threshold values.

26. A decoding device, comprising:
a scaling unit, for adjusting a received signal according to a scaling coefficient and generating a scaled signal;
a quantizer, coupled to the scaling unit, for generating a quantized signal by quantizing the scaled signal;
a soft decision decoder, coupled to the quantizer, for decoding the quantized signal and generating a decoded signal;
a scaling coefficient generating unit, coupled to the scaling unit, for generating the scaling coefficient according to system information of the decoding device; and
a probability calculating unit, coupled to the scaling coefficient generating unit and the quantizer, for estimating a first probability of a first quantized signal being equal to zero, where the first quantized signal corresponds to the first input signal; and further estimating a second probability of a second quantized signal being equal to zero, where the second quantized signal corresponds to the second input signal;
wherein the system information comprises a first ratio of the first probability and a threshold value, and a second ratio of the second probability and the threshold value, and the scaling coefficient generating unit determines the scaling coefficient according to the first ratio and the second ratio.

27. A decoding method comprising:
utilizing a scaling coefficient to adjust a received signal to generate a scaled signal;
quantizing the scaling unit to generate a quantized signal;
decoding the quantized signal to generate a decoded signal;
generating the scaling coefficient according to a system information of the decoding device;
estimating a first bit error rate (BER) corresponding to a first input signal after the first input signal is adjusted by a first scaling coefficient; and)
estimating a second bit error rate corresponding to a second input signal after the second input signal is adjusted by a second scaling coefficient; and
the step of generating the scaling coefficient further comprises:
decreasing the first and second scaling coefficients when a difference between the second bit error rate and the first bit error rate is smaller than a first threshold value;
increasing the first and second scaling coefficients when the difference between the second bit error rate and the first bit error rate is larger than a second threshold value; and
selecting one of the first and the second scaling coefficients as the scaling) coefficient when the difference between the second bit error rate and the first bit error rate is between the first and the second threshold values.

28. A decoding method comprising:
utilizing a scaling coefficient to adjust a received signal to generate a scaled signal;
quantizing the scaling unit to generate a quantized signal;
decoding the quantized signal to generate a decoded signal;
generating the scaling coefficient according to a system information of the decoding device;
estimating a first probability of a first quantized signal being equal to zero, where the first quantized signal corresponds to the first input signal; and
estimating a second probability of a second quantized signal being equal to zero, where the second quantized signal corresponds to the second input signal;
wherein the system information comprises a first different value between the first probability and a threshold value, and a second different value between the second probability and the threshold value.

29. A decoding method comprising:
utilizing a scaling coefficient to adjust a received signal to generate a scaled signal;
quantizing the scaling unit to generate a quantized signal;
decoding the quantized signal to generate a decoded signal;

generating the scaling coefficient according to a system information of the decoding device;

estimating a first bit error rate (BER) corresponding to a first input signal after the first input signal is adjusted by a first scaling coefficient; and estimating a second bit error rate corresponding to a second input signal after the second input signal is adjusted by a second scaling coefficient, wherein the system information comprises the first and the second bit error rates, and the first scaling coefficient is larger than the second scaling coefficient; and the step of generating the scaling coefficient, comprising:

calculating a ratio of the second bit error rate and the first bit error rate;

decreasing the first and second scaling coefficients when the ratio is smaller than a first threshold value;

increasing the first and second scaling coefficients when the ratio is larger than a second threshold value; and selecting one of the first and second scaling coefficients as the scaling coefficient when the ratio is between the first and the second threshold values.

30. A decoding method comprising:

utilizing a scaling coefficient to adjust a received signal to generate a scaled signal;

quantizing the scaling unit to generate a quantized signal;

decoding the quantized signal to generate a decoded signal;

generating the scaling coefficient according to a system information of the decoding device;

estimating a first probability of a first quantized signal being equal to zero, where the first quantized signal corresponds to the first input signal; and estimating a second probability of a second quantized signal being equal to zero, where the second quantized signal corresponds to the second input signal;

wherein the system information comprises a first ratio of the first probability and a threshold value, and a second ratio of the second probability and the threshold value.

* * * * *